(12) United States Patent
Mun et al.

(10) Patent No.: US 10,230,072 B2
(45) Date of Patent: Mar. 12, 2019

(54) FLEXIBLE DISPLAY APPARATUS

(71) Applicants: SAMSUNG SDI CO., LTD., Yongin-si, Gyeonggi-do (KR); SAMSUNG ELECTRONICS CO., LTD., Suwon-si, Gyeonggi-do (KR)

(72) Inventors: Sung Hyun Mun, Suwon-si (KR); Byeong Do Kwak, Suwon-si (KR); Ji Won Kang, Suwon-si (KR); Il Jin Kim, Suwon-si (KR); Ji Ho Kim, Suwon-si (KR); Hyung Rang Moon, Suwon-si (KR); Seon Hee Shin, Suwon-si (KR); Gwang Hwan Lee, Suwon-si (KR); Jin Young Lee, Suwon-si (KR); Ik Hwan Cho, Suwon-si (KR); Jae Hyun Han, Suwon-si (KR); In Chul Hwang, Suwon-si (KR)

(73) Assignees: Samsung SDI Co., Ltd., Yongin-si (KR); Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/491,785

(22) Filed: Apr. 19, 2017

(65) Prior Publication Data

US 2017/0309867 A1    Oct. 26, 2017

(30) Foreign Application Priority Data

Apr. 22, 2016  (KR) .................. 10-2016-0049627
Dec. 14, 2016  (KR) .................. 10-2016-0170836

(51) Int. Cl.
*H01L 51/52* (2006.01)
*C09J 133/06* (2006.01)
(Continued)

(52) U.S. Cl.
CPC ...... *H01L 51/5281* (2013.01); *C09J 133/066* (2013.01); *C09J 133/08* (2013.01);
(Continued)

(58) Field of Classification Search
None
See application file for complete search history.

(56) References Cited

U.S. PATENT DOCUMENTS

2013/0052457 A1*  2/2013  Inui .................. C08F 265/06
                                                     428/336
2014/0162044 A1*  6/2014  Lee .................... C09J 133/066
                                                     428/220
(Continued)

FOREIGN PATENT DOCUMENTS

JP    2007-176542 A    7/2007
KR    10-2010-0002638 A    1/2010

OTHER PUBLICATIONS

Machine Translation of KR-2010-0002638 (Year: 2010).
(Continued)

*Primary Examiner* — Andres Munoz
(74) *Attorney, Agent, or Firm* — Lewis Roca Rothgerber Christie LLP

(57) ABSTRACT

Disclosed is a flexible display apparatus. The flexible display apparatus includes a display part, a first adhesive film, an optical film, a second adhesive film, and a window film sequentially stacked, and the second adhesive film has a water-vapor permeability of about 200 g/m²·24 hr or less, and the first adhesive film has a lower restoration force than the second adhesive film, as calculated by the Equation B set forth herein.

20 Claims, 7 Drawing Sheets

(51) Int. Cl.
*C09J 133/08* (2006.01)
*H01L 27/32* (2006.01)
*G06F 3/041* (2006.01)
*G06F 3/044* (2006.01)

(52) U.S. Cl.
CPC ........ *H01L 27/323* (2013.01); *H01L 51/5246* (2013.01); *H01L 51/5253* (2013.01); *G06F 3/044* (2013.01); *G06F 3/0416* (2013.01); *G06F 2203/04102* (2013.01); *H01L 2251/5338* (2013.01); *H01L 2251/5369* (2013.01); *H01L 2251/556* (2013.01); *H01L 2251/558* (2013.01)

(56) References Cited

U.S. PATENT DOCUMENTS

| | | | |
|---|---|---|---|
| 2016/0026022 A1* | 1/2016 | Jung | G02F 1/133634 349/96 |
| 2016/0122599 A1* | 5/2016 | Kim | C09J 133/066 428/220 |
| 2016/0122600 A1* | 5/2016 | Moon | C09J 133/14 428/354 |
| 2016/0297178 A1 | 10/2016 | Kang et al. | |
| 2017/0015880 A1* | 1/2017 | Kim | C09J 7/22 |
| 2017/0115780 A1 | 4/2017 | Ogikubo | |
| 2017/0162823 A1* | 6/2017 | Kim | B32B 7/12 |
| 2017/0253769 A1* | 9/2017 | Cho | C09J 7/00 |
| 2017/0306193 A1* | 10/2017 | Moon | C09J 133/08 |
| 2017/0355173 A1 | 12/2017 | Tanaka et al. | |

OTHER PUBLICATIONS

BASF Specialty Monomers Technical Data, accessed Sep. 27, 2017 from http://www.specialty-monomers.basf.com/portal/streamer?fid=235715 (Year: 2017).

Thermal Transitions of Homopolymers: Glass Transition and Melting Point, Accessed Sep. 27, 2017 from https://www.signnaaldrich.conn/content/dann/signna-aldrich/docs/Aldrich/General Infornnation/thernnal transitions of honnopolynners.pdf (Year: 2017).

Utracki, Glass Transition Temperature of Polymer Blends, 1985, Advances in Polymer Techology, vol. 5, Issue 1, pp. 33-39 (Year: 1985).

U.S. Office Action dated Aug. 3, 2018, issued in U.S. Appl. No. 15/440,982 (14 pages).

* cited by examiner

FLEXIBLE DISPLAY APPARATUS

CROSS-REFERENCE TO RELATED APPLICATION

This application claims priority to and the benefit of Korean Patent Application No. 10-2016-0049627, filed on Apr. 22, 2016, and Korean Patent Application No. 10-2016-0170836, filed on Dec. 14, 2016 in the Korean Intellectual Property Office, the entire disclosure of each of which is incorporated herein by reference.

BACKGROUND

1. Field

Aspects of embodiments of the present invention relate to a flexible display apparatus.

2. Description of the Related Art

Recently, an optical display apparatus, such as a liquid crystal display, an organic light emitting diode display, and the like, employs a film instead of a glass substrate or a high hardness substrate. To this end, a flexible display apparatus capable of being folded and unfolded has been developed in the related art.

The flexible display apparatus has a structure in which various optical films and window films are stacked on a display part. In particular, the display part may also be manufactured in the form of a film. The display part, the optical film, and the window film may be adhered to each other via optically clear adhesive (OCA) films. Thus, the OCA films are required to combine the display part, the optical film, and the window film, and to allow the flexible display apparatus to be sufficiently folded while securing good reliability and/or durability. For the display apparatus, the OCA films are required to have low variation in yellow index (YI) while exhibiting good transparency.

The flexible display apparatus can be folded in a direction of the display part or in a direction of the window film. Particularly, the flexible display apparatus capable of being folded in the direction of the display part allows many viewers to simultaneously watch the display, thereby providing good utility. Accordingly, there is a need for a flexible display apparatus which can prevent bubble generation or cracking even when folded towards the display part thereof. On the other hand, the display part, particularly, an OLED panel, is vulnerable not only to moisture and/or oxygen but also to external impact. Although a sealing material can be applied to the OLED panel in order to block moisture and/or oxygen from entering the OLED panel, there is a problem of increase in thickness of the flexible display apparatus. In order to improve impact resistance of the OLED, an additional member can be mounted on an upper or lower side of the OLED panel. However, the thickness of the flexible display apparatus can be increased and foldability of the flexible display apparatus can be deteriorated in use.

The background technique of the present invention is disclosed in Japanese Unexamined Patent Publication No. 2007-176542.

SUMMARY

According to an aspect of one or more embodiments of the present invention, a flexible display apparatus includes a display part, a first adhesive film, an optical film, a second adhesive film, and a window film sequentially stacked in the stated order, the second adhesive film has a water vapor transmission rate of about 200 g/m²·24 hr or less, and the first adhesive film has a lower restoration force than the second adhesive film as calculated by the following Equation B:

$$\text{Restoration force} = (1 - (X_1)/(X_2)) \times 100,$$

where $X_1$ and $X_2$ are as defined in the below detailed description of the present invention.

DETAILED DESCRIPTION

Figure 1:
FIG. 1 is a schematic sectional view of a flexible display apparatus according to an embodiment of the present invention.

Some embodiments of the present invention will be described in further detail with reference to the accompanying drawings to provide a thorough understanding of the invention to those skilled in the art. It is to be understood that the present invention may be embodied in different ways and is not limited to the following embodiments. In the drawings, portions irrelevant to the description may be omitted for clarity. Like components are denoted by like reference numerals throughout the specification.

Herein, spatially relative terms such as "upper" and "lower" are defined with reference to the accompanying drawings. Thus, it is to be understood that "upper" can be used interchangeably with "lower." It is to be understood that, when a layer is referred to as being "on" another layer, it can be directly formed on the other layer, or one or more intervening layers may also be present. Thus, it is to be understood that, when a layer is referred to as being "directly on" another layer, no intervening layer is interposed therebetween.

Herein, the term "(meth)acryl" refers to acryl and/or methacryl and the term "copolymer" may include an oligomer, a polymer, or a resin.

Herein, the term "modulus" of adhesive film means storage modulus (G').

Herein, the term "average particle diameter of organic nanoparticles" refers to a z-average particle diameter of the nanoparticles, as measured in a water-based solvent or organic solvent using a Zetasizer nano-ZS (Malvern Co., Ltd.), and confirmed by SEM/TEM.

Herein, the term "core-shell structure" means a typical core-shell structure. In addition, each of the core and the shell may be composed of a single layer or multiple layers, and the term "outermost layer" refers to the outermost layer among several layers.

Herein, "water vapor transmission rate" of an adhesive film is a value measured in accordance with KS A 1013 water vapor transmission rate test.

Herein, "variation rate in yellowness index" of an adhesive film is a value calculated by the following Equation A:

$$\text{Variation rate in yellowness index} = |Y2 - Y1|/Y1 \times 100, \quad \text{<Equation A>}$$

where Y1 is an initial yellowness index of the adhesive film, and Y2 is a yellowness index thereof measured after leaving the adhesive film at 60° C. and 95% relative humidity (RH) for 240 hours.

Herein, "restoration force" can be calculated by the following Equation B:

$$\text{Restoration force} = (1-(X_1)/(X_2)) \times 100, \quad \text{<Equation B>}$$

where $X_1$ and $X_2$ are values obtained through the following procedure, where both ends of a polyethylene terephthalate (PET) film are defined as a first end and a second end, respectively. A specimen for calculation of restoration force is prepared by attaching a first PET film and a second PET film to each other via an adhesive film having a size of length×width (20 mm×20 mm), such that the first end of the first PET film and the second end of the second PET film are attached to each other in order of a first end of the first PET film/adhesive film/a second end of the second PET film. A jig is secured to the second end of the first PET film and the first end of the second PET film, respectively. With one of the jigs secured under a load of 10 MPa, the other jig is pulled at 25° C. and at 300 mm/min until the adhesive film has a length $X_2$ (unit: μm) of 1,000% of an initial thickness $X_0$ (unit: μm) thereof, that is, 10 times the initial thickness of the adhesive film, and is maintained for about 10 seconds, followed by restoring the other jig at the same speed (i.e. at 300 mm/min) as the pulling speed to obtain a stretched length $X_1$ (unit: μm) of the adhesive film upon application of 0 kPa to the adhesive film in a graph wherein the X-axis is the stretched length of the adhesive film and the Y-axis is force applied to the adhesive film.

Herein, the term "bubble generation area ratio" of the display apparatus refers to a value (%) measured on a specimen simulating to a display apparatus and obtained by sequentially stacking a polyethylene terephthalate (PET) film (thickness: 100 μm) as a display part, a first adhesive film (thickness: 50 μm), a PET film (thickness: 50 μm) as an optical film, a second adhesive film (thickness: 50 μm), and a PET film (thickness: 125 μm) as a window film. The specimen is cut to a size of length×width (160 mm×100 mm) and is bent towards the display part so as to be placed between parallel frames having a gap of about 1 cm therebetween and such that the width of the specimen is halved, and is subjected to aging at 60° C. and 93% RH for about 24 hours. An image is obtained by photographing a portion of the specimen suffering from bubble generation using an optical microscope (EX-51, Olympus Co., Ltd., magnification: 30×). The image is analyzed by using Mac-View software (Mountech Co., Ltd.) in order to measure a ratio (%) of the total area occupied by bubbles to the total area of the specimen as the bubble generation area ratio.

Herein, a flexible display apparatus according to an embodiment of the present invention will be described with reference to FIG. 1. FIG. 1 is a sectional view of a flexible display apparatus according to an embodiment of the present invention.

Referring to FIG. 1, a flexible display apparatus 100 according to an embodiment includes a display part 91, a first adhesive film 92 formed on the display part 91, an optical film 93 formed on the first adhesive film 92, a second adhesive film 94 formed on the optical film 93, and a window film 95 formed on the second adhesive film 94.

The first adhesive film 92 may be interposed between the display part 91 and the optical film 93 to attach the display part 91 to the optical film 93.

The first adhesive film 92 may exhibit a lower restoration force than the second adhesive film 94, thereby allowing the flexible display apparatus 100 to be efficiently folded when the flexible display apparatus 100 is folded in a direction of the display part 91 under low temperature or high temperature/humidity conditions. Thus, the flexible display apparatus 100 may have a bubble generation area ratio of 0%, as measured on a specimen that includes the first adhesive film 92 and the second adhesive film 94 and adopts PET films as the display part 91, the optical film 93, and the window film 95, respectively, and is left after being folded. In an embodiment, the flexible display apparatus 100 may have a bubble generation area ratio of 0%, as measured on the specimen, which is prepared by sequentially stacking a polyethylene terephthalate (PET) film (thickness: 100 μm) as a display part, a first adhesive film (thickness: 50 μm), a PET film (thickness: 50 μm) as an optical film, a second adhesive film (thickness: 50 μm), and a PET film (thickness: 125 μm) as a window film. The specimen is cut to a size of length×width (160 mm×100 mm), bent towards the display part such that the width of the specimen is halved, so as to be placed between parallel frames having a gap of about 1 cm therebetween, and is subjected to aging at 60° C. and 93% RH for about 24 hours.

A ratio of restoration force of the second adhesive film 94 to restoration force of the first adhesive film 92 (restoration force of the second adhesive film/restoration force of the first adhesive film) may be greater than 1, and, in an embodiment, greater than 1 to 1.5 or less. Within this range, the flexible display apparatus 100 can exhibit good foldability when folded towards the display part 91. The first adhesive film 92 may have a restoration force of about 40% to about 90%, and, in an embodiment, about 60% to about 90%, and, in an embodiment, about 70% to about 90%, for example, about 40%, about 41%), about 42%, about 43%, about 44%, about 45%, about 46%, about 47%, about 48%, about 49%, about 50%, about 51%, about 52%, about 53%, about 54%, about 55%, about 56%, about 57%, about 58%, about 59%, about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%), about 82%, about 83%, about 84%, about 85%, about 86%, about 87%, about 88%, about 89%, or about 90%. Within this range, the flexible display apparatus 100 can satisfy the restoration force ratio as described above while exhibiting good foldability.

The first adhesive film 92 has good impact resistance with respect to an OLED element and has a lower restoration force than the second adhesive film 94, thereby allowing the flexible display apparatus 100 to be folded towards the display part 91.

The second adhesive film 94 may be interposed between the optical film 93 and the window film 95 to attach the optical film 93 to the window film 95.

The second adhesive film 94 may have a water vapor transmission rate of about 200 g/m²·24 hr or less, and, in an embodiment, about 190 g/m²·24 hr or less, for example, about 0 g/m²·24 hr, about 10 g/m²·24 hr, about 20 g/m²·24 hr, about 30 g/m²·24 hr, about 40 g/m²·24 hr, about 50 g/m²·24 hr, about 60 g/m²·24 hr, about 70 g/m²·24 hr, about 80 g/m²·24 hr, about 90 g/m²·24 hr, about 100 g/m²·24 hr, about 110 g/m²·24 hr, about 120 g/m²·24 hr, about 130 g/m²·24 hr, about 140 g/m²·24 hr, about 150 g/m²·24 hr, about 160 g/m²·24 hr, about 170 g/m²·24 hr, about 180 g/m²·24 hr, about 190 g/m²·24 hr, or about 200 g/m²·24 hr. Within this range, the second adhesive film 94 can improve life span and reliability of the display part 91, for example, an OLED panel. Particularly, if the window film 95 is formed of a polyimide film or the like having high water vapor transmission rate, not only the display part but also the optical film, the adhesive films, and the like can be damaged due to absorption of external moisture. However, the low vapor transmission rate of the second adhesive film 94 means that the second adhesive film 94 blocks external moisture from entering the flexible display apparatus, thereby preventing or substantially preventing such damage.

The second adhesive film 94 may have a restoration force of about 50% to about 95%. In an embodiment, the second adhesive film 94 may have a restoration force of about 60% to about 95%, and, in an embodiment, about 70% to about 95%, for example, about 50%, about 51%, about 52%, about 53%, about 54%, about 55%, about 56%, about 57%, about 58%, about 59%, about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, about 90%, about 91%, about 92%, about 93%, about 94%, or about 95%. Within this range, the flexible display apparatus 100 can satisfy the restoration force ratio as described above while exhibiting good foldability.

The first adhesive film 92 has a lower modulus than the second adhesive film 94 and exhibits good reliability and durability under high temperature and/or high humidity conditions. As a result, the flexible display apparatus 100 can exhibit good foldability not only at room temperature but also at low temperature or under high temperature/humidity conditions, and can prevent or substantially prevent bubble generation, cracking, and/or delamination under high temperature and/or high humidity conditions, thereby providing good reliability and durability under high temperature and/or high humidity conditions. A modulus ratio (modulus of the second adhesive film/modulus of the first adhesive film, provided that the modulus of each adhesive film is measured at the same temperature) at −20° C. to 25° C. may be greater than 1.0 to about 10 or less, and, in an embodiment, 1.01 to about 10, and, in an embodiment, 1.01 to about 5, for example, about 1.5, about 2, about 3, about 4, about 5, about 6, about 7, about 8, about 9, or about 10. Within this range, the adhesive films can exhibit good foldability and good reliability and durability under high temperature/humidity conditions, and the window film and/or the display part can be sufficiently connected to each other and allow repeated folding even when provided in film form. A modulus ratio (modulus of the second adhesive film 94/modulus of the first adhesive film 92, provided that the modulus of each adhesive film is measured at the same temperature) at 80° C. may be about 1.0 or more, and, in an embodiment, about 1.1 to about 5, for example, about 1.1, about 1.5, about 2.0, about 2.5, about 3.0, about 3.5, about 4.0, about 4.5, or about 5.0.

Each of the first and second adhesive films 92, 94 may have a ratio of modulus at 80° C. to modulus at −20° C. (modulus at 80° C.:modulus at −20° C.) of about 1:1 to about 1:10, and, in an embodiment, about 1:1 to about 1:8, and, in an embodiment, about 1:1 to about 1:6, for example, about 1:1, about 1:2, about 1:3, about 1:4, about 1:5, about 1:6, about 1:7, about 1:8, about 1:9, or about 1:10. Within this range, the adhesive films can exhibit good foldability at low temperature, room temperature and high temperature, can prevent or substantially prevent deterioration in adhesion between adherends in a wide temperature range (−20° C. to 80° C.), and can be used in a flexible optical member.

Each of the first and second adhesive films 92, 94 may have a modulus at 25° C. of about 15 kPa to about 500 kPa, and, in an embodiment, about 20 kPa to about 300 kPa, for example, about 15 kPa, about 20 kPa, about 25 kPa, about 30 kPa, about 35 kPa, about 40 kPa, about 45 kPa, about 50 kPa, about 55 kPa, about 60 kPa, about 65 kPa, about 70 kPa, about 75 kPa, about 80 kPa, about 85 kPa, about 90 kPa, about 95 kPa, about 100 kPa, about 110 kPa, about 120 kPa, about 130 kPa, about 140 kPa, about 150 kPa, about 160 kPa, about 170 kPa, about 180 kPa, about 190 kPa, about 200 kPa, about 210 kPa, about 220 kPa, about 230 kPa, about 240 kPa, about 250 kPa, about 260 kPa, about 270 kPa, about 280 kPa, about 290 kPa, about 300 kPa, about 310 kPa, about 320 kPa, about 330 kPa, about 340 kPa, about 350 kPa, about 360 kPa, about 370 kPa, about 380 kPa, about 390 kPa, about 400 kPa, about 410 kPa, about 420 kPa, about 430 kPa, about 440 kPa, about 450 kPa, about 460 kPa, about 470 kPa, about 480 kPa, about 490 kPa, or about 500 kPa. Within this range, the flexible display apparatus 100 can prevent or substantially prevent damage to the window film 95 when folded towards the display part 91.

Each of the first and second adhesive films 92, 94 may have a modulus at −20° C. of about 20 kPa to about 500 kPa, and, in an embodiment, about 20 kPa to about 400 kPa, and, in an embodiment, about 30 kPa to about 300 kPa, for example, about 20 kPa, about 25 kPa, about 30 kPa, about 35 kPa, about 40 kPa, about 45 kPa, about 50 kPa, about 55 kPa, about 60 kPa, about 65 kPa, about 70 kPa, about 75 kPa, about 80 kPa, about 85 kPa, about 90 kPa, about 95 kPa, about 100 kPa, about 110 kPa, about 120 kPa, about 130 kPa, about 140 kPa, about 150 kPa, about 160 kPa, about 170 kPa, about 180 kPa, about 190 kPa, about 200 kPa, about 210 kPa, about 220 kPa, about 230 kPa, about 240 kPa, about 250 kPa, about 260 kPa, about 270 kPa, about 280 kPa, about 290 kPa, about 300 kPa, about 310 kPa, about 320 kPa, about 330 kPa, about 340 kPa, about 350 kPa, about 360 kPa, about 370 kPa, about 380 kPa, about 390 kPa, about 400 kPa, about 410 kPa, about 420 kPa, about 430 kPa, about 440 kPa, about 450 kPa, about 460 kPa, about 470 kPa, about 480 kPa, about 490 kPa, or about 500 kPa. Within this range, regardless of the second adhesive film 94, the flexible display apparatus 100 can be folded well even at low temperature, and the window film 95 and/or the display part 91 can be sufficiently connected to each other and allow repeated folding even when provided in film form.

Each of the first and second adhesive films 92, 94 may have a modulus at 80° C. of about 10 kPa to about 500 kPa, and, in an embodiment, about 12 kPa to about 300 kPa, for example, about 10 kPa, about 15 kPa, about 20 kPa, about 25 kPa, about 30 kPa, about 35 kPa, about 40 kPa, about 45 kPa, about 50 kPa, about 55 kPa, about 60 kPa, about 65 kPa, about 70 kPa, about 75 kPa, about 80 kPa, about 85 kPa, about 90 kPa, about 95 kPa, about 100 kPa, about 110 kPa, about 120 kPa, about 130 kPa, about 140 kPa, about 150 kPa, about 160 kPa, about 170 kPa, about 180 kPa, about 190 kPa, about 200 kPa, about 210 kPa, about 220 kPa, about 230 kPa, about 240 kPa, about 250 kPa, about 260 kPa, about 270 kPa, about 280 kPa, about 290 kPa, about 300 kPa, about 310 kPa, about 320 kPa, about 330 kPa, about 340 kPa, about 350 kPa, about 360 kPa, about 370 kPa, about 380 kPa, about 390 kPa, about 400 kPa, about 410 kPa, about 420 kPa, about 430 kPa, about 440 kPa, about 450 kPa, about 460 kPa, about 470 kPa, about 480 kPa, about 490 kPa, or about 500 kPa. Within this range, the flexible display apparatus 100 can prevent or substantially prevent damage to the window film 95 when folded towards the display part 91.

Each of the first and second adhesive films 92, 94 may have a peel strength at 25° C. of about 800 gf/in or more, and, in an embodiment, about 1,100 gf/in to about 2,500 gf/in, for example, about 800 gf/in, about 900 gf/in, about 1,000 gf/in, about 1,100 gf/in, about 1,200 gf/in, about 1,300 gf/in, about 1,400 gf/in, about 1,500 gf/in, about 1,600 gf/in, about 1,700 gf/in, about 1,800 gf/in, about 1,900 gf/in, about 2,000 gf/in, about 2,100 gf/in, about 2,200 gf/in, about 2,300 gf/in, about 2,400 gf/in, or about 2,500 gf/in. Within this range, the first and second adhesive films 92, 94 can efficiently attach the display part 91, the optical film 93, and the window film 95 to one another, thereby improving reliability of the flexible display apparatus 100. Herein, "peel strength" refers to T-peel strength.

Each of the first and second adhesive films 92, 94 may have a variation rate in yellowness index (YI) of about 5% or less, and, in an embodiment, about 0% to about 1%, for example, about 0%, about 1%, about 2%, about 3%, about 4%, or about 5%. Within this range, the flexible display apparatus 100 can exhibit good durability even after the flexible display apparatus 100 is left under high temperature/humidity conditions for a long period of time.

Each of the first and second adhesive films 92, 94 may have a Y1 value in Equation A of about 1 or less, and, in an embodiment, about 0.5 or less, for example, about 0, about 0.1, about 0.2, about 0.3, about 0.4, about 0.5, about 0.6, about 0.7, about 0.8, about 0.9, or about 1, and a Y2 value in Equation A of about 1 or less, and, in an embodiment, about 0.5 or less, for example, about 0, about 0.1, about 0.2, about 0.3, about 0.4, about 0.5, about 0.6, about 0.7, about 0.8, about 0.9, or about 1.

Each of the first and second adhesive films 92, 94 may have a haze of about 3% or less, and, in an embodiment, about 2% or less, and, in an embodiment, about 1% or less, in a thickness of 50 μm and in the visible range (for example: 300 nm to 800 nm). Within this range, the adhesive films 92, 94 can improve transparency of displays when used in the displays.

Each of the first and second adhesive films 92, 94 may have a thickness of about 1 μm to about 2 mm, and, in an embodiment, about 20 μm to about 1 mm, and, in an embodiment, about 50 μm to about 100 μm. Within this range, the adhesive film can be used in an optical display apparatus.

Each of the first adhesive film 92 and the second adhesive film 94 may have a dielectric constant of about 1.8 to about 3.0 at 1 MHz. Within this range, the adhesive films allow a display apparatus to be driven without failure even when stacked on a transparent conductive film in a touch panel.

Each of the first and second adhesive films 92, 94 may include a cured product of an adhesive composition. Herein, an adhesive composition for the first adhesive film 92 and the second adhesive film 94 according to an embodiment of the invention (herein, "adhesive composition") will be described.

The adhesive composition for each of the first and second adhesive films 92, 94 may include a monomer mixture for a hydroxyl group-containing (meth)acrylic copolymer, and an initiator. In the adhesive composition, the monomer mixture may be used as a non-polymerized monomer mixture or may be used as a partially polymerized mixture.

The monomer mixture may form a hydroxyl group-containing (meth)acrylic copolymer. The hydroxyl group-containing (meth)acrylic copolymer forms a matrix of the adhesive film and can provide adhesive properties to the adhesive film. The hydroxyl group-containing (meth)acrylic copolymer may have a glass transition temperature of about −150° C. to about −13° C., and, in an embodiment, about −100° C. to about −20° C., for example, about −150° C., about −140° C., about −130° C., about −120° C., about −110° C., about −100° C., about −90° C., about −80° C., about −70° C., about −60° C., about −50° C., about −40° C., about −30° C., or about −20° C. Within this range, the adhesive film can exhibit good foldability and good adhesive strength and reliability in a wide temperature range. The monomer mixture may include a hydroxyl group-containing (meth)acrylate and a comonomer. The "comonomer" is different from the hydroxyl group-containing (meth)acrylate.

The hydroxyl group-containing (meth)acrylate may include at least one of a (meth)acrylic acid ester containing a $C_1$ to $C_{20}$ alkyl group having at least one hydroxyl group, a (meth)acrylic acid ester containing a $C_5$ to $C_{20}$ cycloalkyl group having at least one hydroxyl group, and a (meth)acrylic acid ester containing a $C_6$ to $C_{20}$ aryl group having at least one hydroxyl group. The hydroxyl group-containing (meth)acrylate may include at least one of 2-hydroxyethyl (meth)acrylate, 2-hydroxypropyl (meth)acrylate, 3-hydroxypropyl (meth)acrylate, 2-hydroxybutyl (meth)acrylate, 4-hydroxybutyl (meth)acrylate, 6-hydroxyhexyl (meth)acrylate, 1,4-cyclohexanedimethanol mono(meth)acrylate, 1-chloro-2-hydroxypropyl (meth)acrylate, diethylene glycol mono(meth)acrylate, 1,6-hexanediol mono(meth)acrylate, pentaerythritol tri(meth)acrylate, dipentaerythritol penta(meth)acrylate, neopentylglycol mono(meth)acrylate, trimethylolpropane di(meth)acrylate, trimethylolethane di(meth)acrylate, 2-hydroxy-3-phenyloxypropyl (meth)acrylate, 4-hydroxycyclopentyl (meth)acrylate, 4-hydroxycyclohexyl (meth)acrylate, and cyclohexanedimethanol mono(meth)acrylate, without being limited thereto. Particularly, as the hydroxyl group-containing (meth)acrylate, a (meth)acrylate containing a $C_1$ to $C_5$ alkyl group having at least one hydroxyl group can significantly improve adhesion of the adhesive film.

The hydroxyl group-containing (meth)acrylic monomer may be present in an amount of about 5% by weight (wt %) to about 40 wt %, and, in an embodiment, about 10 wt % to about 35 wt %, for example, about 5 wt %, about 6 wt %, about 7 wt %, about 8 wt %, about 9 wt %, about 10 wt %, about 11 wt %, about 12 wt %, about 13 wt %, about 14 wt %, about 15 wt %, about 16 wt %, about 17 wt %, about 18 wt %, about 19 wt %, about 20 wt %, about 21 wt %, about 22 wt %, about 23 wt %, about 24 wt %, about 25 wt %, about 26 wt %, about 27 wt %, about 28 wt %, about 29 wt %, about 30 wt %, about 31 wt %, about 32 wt %, about 33 wt %, about 34 wt %, about 35 wt %, about 36 wt %, about 37 wt %, about 38 wt %, about 39 wt %, or about 40 wt %, in the monomer mixture. Within this range, the adhesive film has low haze and low water vapor transmission rate, and can exhibit good adhesion.

The comonomer may include at least one of an alkyl (meth)acrylate monomer, an ethylene oxide-containing monomer, a propylene oxide-containing monomer, an amine group-containing monomer, an amide group-containing monomer, an alkoxy group-containing monomer, a phosphate group-containing monomer, a sulfonic acid group-containing monomer, a phenyl group-containing monomer, and a silane group-containing monomer, without being limited thereto.

The alkyl (meth)acrylate monomer may include an unsubstituted $C_1$ to $C_{20}$ linear or branched alkyl (meth)acrylic ester. For example, the alkyl (meth)acrylate monomer may include at least one of methyl (meth)acrylate, ethyl (meth)acrylate, propyl (meth)acrylate, n-butyl (meth)acrylate, t-butyl (meth)acrylate, iso-butyl (meth)acrylate, pentyl (meth)acrylate, hexyl (meth)acrylate, heptyl (meth)acrylate, ethylhexyl (meth)acrylate, octyl (meth)acrylate, isooctyl (meth)acrylate, nonyl (meth)acrylate, decyl (meth)acrylate, and lauryl (meth)acrylate. In an embodiment, a $C_4$ to $C_8$, particularly, branched, alkyl (meth)acrylic acid ester is used to improve initial adhesive strength of the adhesive film.

The ethylene oxide-containing monomer is a (meth)acrylate monomer containing an ethylene oxide group ($—CH_2CH_2O—$), and may include any of polyethylene oxide alkyl ether (meth)acrylates, such as polyethylene oxide monomethyl ether (meth)acrylate, polyethylene oxide monoethyl ether (meth)acrylate, polyethylene oxide monopropyl ether (meth)acrylate, polyethylene oxide monobutyl ether (meth)acrylate, polyethylene oxide monopentyl ether (meth)acrylate, polyethylene oxide dimethyl ether (meth)acrylate, polyethylene oxide diethyl ether (meth)acrylate, polyethylene oxide monoisopropyl ether (meth)acrylate, polyethylene oxide monoisobutyl ether (meth)acrylate, and polyethylene oxide mono-tert-butyl ether (meth)acrylate, without being limited thereto.

The propylene oxide-containing monomer is a (meth)acrylate monomer containing a propylene oxide group ($—CH_2CH_2CH_2O—$ or $—CH_2CHCH_3O—$), and may include any of polypropylene oxide alkyl ether (meth)acrylates, such as polypropylene oxide monomethyl ether (meth)acrylate, polypropylene oxide monoethyl ether (meth)acrylate, polypropylene oxide monopropyl ether (meth)acrylate, polypropylene oxide monobutyl ether (meth)acrylate, polypropylene oxide monopentyl ether (meth)acrylate, polypropylene oxide dimethyl ether (meth)acrylate, polypropylene oxide diethyl ether (meth)acrylate, polypropylene oxide monoisopropyl ether (meth)acrylate, polypropylene oxide monoisobutyl ether (meth)acrylate, and polypropylene oxide mono-tert-butyl ether (meth)acrylate, without being limited thereto.

The amine group-containing monomer may include any of amine group-containing (meth)acrylic monomers, such as monomethylaminoethyl (meth)acrylate, monoethylaminoethyl (meth)acrylate, monomethylaminopropyl (meth)acrylate, monoethylaminopropyl (meth)acrylate, dimethylaminoethyl (meth)acrylate, diethylaminoethyl (meth)acrylate, N-tert-butylaminoethyl (meth)acrylate, and methacryloxyethyltrimethyl ammonium chloride (meth)acrylate, without being limited thereto.

The amide group-containing monomer may include any of amide group-containing (meth)acrylic monomers, such as (meth)acrylamide, N-methyl (meth)acrylamide, N-methylol (meth)acrylamide, N-methoxymethyl (meth)acrylamide, N,N-methylene bis(meth)acrylamide, and N-2-hydroxyethyl (meth)acrylamide, without being limited thereto.

The alkoxy group-containing monomer may include any of alkoxy group-containing (meth)acrylic monomers, such as 2-methoxyethyl (meth)acrylate, 2-methoxypropyl (meth)acrylate, 2-ethoxypropyl (meth)acrylate, 2-butoxypropyl (meth)acrylate, 2-methoxypentyl (meth)acrylate, 2-ethoxypentyl (meth)acrylate, 2-butoxyhexyl (meth)acrylate, 3-methoxypentyl (meth)acrylate, 3-ethoxypentyl (meth)acrylate, and 3-butoxyhexyl (meth)acrylate, without being limited thereto.

The phosphate group-containing monomer may include any of phosphate group-containing (meth)acrylic monomers, such as 2-(meth)acryloyloxyethyldiphenylphosphate (meth)acrylate, tri(meth)acryloyloxyethylphosphate (meth)acrylate, and triacryloyloxyethylphosphate (meth)acrylate, without being limited thereto.

The sulfonic acid group-containing monomer may include any of sulfonic acid group-containing acrylic monomers, such as sodium sulfopropyl(meth)acrylate, sodium 2-sulfoethyl (meth)acrylate, and sodium 2-acrylamido-2-methylpropane sulfonate, without being limited thereto.

The phenyl group-containing monomer may include any of phenyl group-containing (meth)acrylic monomers, such as p-tert-butylphenyl (meth)acrylate and o-biphenyl(meth)acrylate, without being limited thereto.

The silane group-containing monomer may include any of silane group-containing vinyl monomers, such as 2-acetoacetoxyethyl (meth)acrylate, vinyltrimethoxysilane, vinyltriethoxysilane, vinyl tris(ρ-methoxyethyl)silane, vinyltriacetylsilane, and methacryloyloxypropyltrimethoxysilane, without being limited thereto.

The comonomer may be present in an amount of about 60 wt % to about 95 wt %, and, in an embodiment, about 65 wt % to about 90 wt %, for example, about 60 wt %, about 61 wt %, about 62 wt %, about 63 wt %, about 64 wt %, about 65 wt %, about 66 wt %, about 67 wt %, about 68 wt %, about 69 wt %, about 70 wt %, about 71 wt %, about 72 wt %, about 73 wt %, about 74 wt %, about 75 wt %, about 76 wt %, about 77 wt %, about 78 wt %, about 79 wt %, about 80 wt %, about 81 wt %, about 82 wt %, about 83 wt %, about 84 wt %, about 85 wt %, about 86 wt %, about 87 wt %, about 88 wt %, about 89 wt %, about 90 wt %, about 91 wt %, about 92 wt %, about 93 wt %, about 94 wt %, or about 95 wt %, in the monomer mixture. Within this range, the adhesive film can exhibit good adhesion and reliability.

In an embodiment, the monomer mixture may include the hydroxyl group-containing (meth)acrylate and a comonomer, and a homopolymer of the comonomer has a glass transition temperature of −150° C. to 0° C. Herein, the "glass transition temperature" may be measured with respect to a homopolymer of each target monomer using a DSC Q20 (TA Instrument Inc.). A homopolymer of each monomer is heated to about 160° C. at a rate of about 20° C./min, slowly cooled and maintained at about −180° C. in an equilibrium state, and heated to about 160° C. at a rate of 10° C./min in order to obtain an endothermic transition curve. An inflection point of the endothermic transition curve is determined as the glass transition temperature. The comonomer, a homopolymer of which has a glass transition temperature of about −150° C. to about 0° C., may include a comonomer, a homopolymer of which has a glass transition temperature of about −150° C. to about −20° C., and, in an embodiment, about −150° C. to about −40° C., for example, about −150° C., −140° C., −130° C., −120° C., −110° C., −100° C., −90° C., −80° C., −70° C., −60° C., −50° C., −40° C., −30° C., −20° C., −10° C., or 0° C. Within this range, the adhesive film can exhibit good foldability at low temperature. The comonomer may include at least one selected from among, for example, alkyl (meth)acrylate monomers including methyl acrylate, ethyl acrylate, isopropyl acrylate, n-butyl acrylate, isobutyl acrylate, hexyl (meth)acrylate, heptyl (meth)acrylate, 2-ethylhexyl acrylate, dodecyl (meth)acrylate, and the like; alkylene oxide-containing (meth)acrylate monomers including polyethylene oxide monomethyl ether (meth)acrylate, polyethylene oxide monoethyl ether (meth)acrylate, polyethylene oxide monopropyl ether (meth)acrylate, polyethylene oxide monobutyl ether (meth)acrylate, polyethylene oxide monopentyl ether (meth)acrylate, polypropylene oxide monomethyl ether (meth)acrylate, polypropylene oxide monoethyl ether (meth)acrylate, polypropylene oxide monopropyl ether (meth)acrylate, and the like;

amino group-containing (meth)acrylate monomers including monomethylaminoethyl (meth)acrylate, monoethylaminoethyl (meth)acrylate, monomethylaminopropyl (meth)acrylate, monoethylaminopropyl (meth)acrylate, and the like; alkoxy group-containing (meth)acrylate monomers including 2-methoxy ethyl (meth)acrylate, 2-methoxypropyl (meth)acrylate, 2-ethoxypropyl (meth)acrylate, and the like; and silane group-containing (meth)acrylate monomers including 2-acetoacetoxyethyl (meth)acrylate, vinyltrimethoxysilane, vinyltriethoxysilane, and the like.

The monomer mixture may further include a carboxylic acid group-containing monomer. The carboxylic acid group-containing monomer may include any of (meth)acrylic acid, 2-carboxyethyl (meth)acrylate, 3-carboxypropyl (meth)acrylate, 4-carboxybutyl (meth)acrylate, itaconic acid, crotonic acid, maleic acid, fumaric acid, and maleic anhydride, without being limited thereto. The carboxylic acid group-containing monomer may be present in an amount of about 5 wt % or less, and, in an embodiment, about 3 wt % or less, and, in an embodiment, about 1 wt % or less, in the monomer mixture. Within this range, the adhesive film has further improved properties in terms of adhesion and reliability.

The monomer mixture may further include an alicyclic group-containing (meth)acrylate. The alicyclic group-containing (meth)acrylate is a $C_5$ to $C_{20}$ cycloalkyl (meth)acrylate monomer and may include any of isobornyl (meth)acrylate, bonyl (meth)acrylate, and cyclohexyl(meth)acrylate, without being limited thereto. These may be used alone or as a mixture thereof. The alicyclic group-containing (meth)acrylate may be present in an amount of about 0.01 wt % to about 5 wt %, and, in an embodiment, about 0.5 wt % to about 3 wt %, and, in an embodiment, about 1 wt % to about 3 wt %, in the monomer mixture. Within this range, the adhesive film does not suffer from bubble generation or slight lifting under heat/moisture test conditions and exhibits good durability.

The initiator can cure the monomer mixture or the (meth)acrylic copolymer prepared through partial polymerization thereof. The initiator may be a radical photopolymerization initiator or a heat polymerization initiator, which is the same as or different from the initiator used in preparation of the hydroxyl group-containing (meth)acrylic copolymer. The photopolymerization initiator may be any initiator so long as the initiator can induce polymerization of the radical polymerizable compound during curing through light irradiation. For example, the photopolymerization initiator may include any of benzoin, acetophenone, hydroxy ketone, amino ketone, phosphine oxide photoinitiators, and the like. In an embodiment, the photopolymerization initiator may include any of benzoin, benzoin methyl ether, benzoin ethyl ether, benzoin isopropyl ether, benzoin n-butyl ether, benzoin isobutyl ether, acetophenone compounds such as acetophenone, dimethylamino acetophenone, 2,2-dimethoxy-2-phenylacetophenone, and 2,2-diethoxy-2-phenylacetophenone, 2-hydroxy-2-methyl-1-phenylpropane-1-one, 1-hydroxycyclohexylphenylketone, 2-methyl-1-[4-(methylthio)phenyl]-2-morpholino-propane-1-one, 4-(2-hydroxyethoxy)phenyl-2-(hydroxy-2-propyl)ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylamino benzoic acid ester, oligo[2-hydroxy-2-methyl-1-[4-(1-methylvinyl)phenyl]propanone], and 2,4,6-trimethylbenzoyl-diphenyl-phosphine oxide, without being limited thereto. These photopolymerization initiators may be used alone or in combination thereof. The heat polymerization initiator may include any initiator so long as the initiator can induce polymerization of the polymerizable compound. For example, the heat polymerization initiator may include any typical initiator, for example, azo, peroxide and redox compounds. Examples of the azo compound may include 2,2-azobis(2-methylbutyronitrile), 2,2-trilazobis(isobutyronitrile), 2,2-trilazobis(2,4-dimethylvaleronitrile), 2,2-nitazobis-2-hydroxymethylpropionitrile, dimethyl-2,2-methylazobis(2-methylpropionate), and 2,2-pioazobis(4-methoxy-2,4-dimethylvaleronitrile), without being limited thereto. Examples of the peroxide compound may include: inorganic peroxides such as potassium perchlorate, ammonium persulfate, and hydrogen peroxide; and organic peroxides such as diacetyl peroxide, peroxydicarbonate, peroxy ester, tetramethylbutyl peroxyneodecanoate, bis(4-butylcyclohexyl)peroxydicarbonate, di(2-ethylhexyl)peroxy carbonate, butylperoxy neodecanoate, dipropyl peroxydicarbonate, diisopropyl peroxydicarbonate, diethoxyethyl peroxydicarbonate, diethoxyhexyl peroxydicarbonate, hexyl peroxydicarbonate, dimethoxybutyl peroxydicarbonate, bis(3-methoxy-3-methoxybutyl) peroxydicarbonate, dibutyl peroxydicarbonate, dicetyl peroxydicarbonate, dimyristyl peroxydicarbonate, 1,1,3,3-tetramethylbutyl peroxypivalate, hexyl peroxypivalate, butyl peroxypivalate, trimethylhexanoyl peroxide, dimethyl hydroxybutyl peroxyneodecanoate, amyl peroxyneodecanoate, butyl peroxyneodecanoate, t-butylperoxy neoheptanoate, amyl peroxypivalate, t-butyl peroxypivalate, t-amyl peroxy-2-ethylhexanoate, lauroyl peroxide, dilauroyl peroxide, didecanoyl peroxide, benzoyl peroxide, and dibenzoyl peroxide, without being limited thereto. Examples of the redox compound may include mixtures of a peroxide compound and a reductant, without being limited thereto. The initiator may be present in an amount of about 0.0001 parts by weight to about 5 parts by weight, and, in an embodiment, about 0.001 parts by weight to about 3 parts by weight, and, in an embodiment, about 0.001 parts by weight to about 1 part by weight, relative to 100 parts by weight of the monomer mixture. Within this range, the initiator allows complete curing of the adhesive composition and can prevent or substantially prevent deterioration in transmittance of the adhesive film due to residual initiator.

The adhesive composition may further include a crosslinking agent. The crosslinking agent is a polyfunctional (meth)acrylate, and may include, for example, any of bifunctional acrylates such as 1,4-butanediol di(meth)acrylate, 1,6-hexanediol di(meth)acrylate, neopentylglycol di(meth)acrylate, polyethyleneglycol di(meth)acrylate, neopentylglycol adipate di(meth)acrylate, dicyclopentanyl di(meth)acrylate, caprolactone-modified dicyclopentenyl di(meth)acrylate, ethylene oxide-modified di(meth)acrylate, di(meth)acryloxyethyl isocyanurate, allylated cyclohexyl di(meth)acrylate, tricyclodecanedimethanol (meth)acrylate, dimethylol dicyclopentane di(meth)acrylate, ethylene oxide-modified hexahydrophthalic acid di(meth)acrylate, tricyclodecane dimethanol (meth)acrylate, neopentylglycol-modified trimethylpropane di(meth)acrylate, adamantane di(meth)acrylate, and 9,9-bis[4-(2-acryloyloxyethoxy)phenyl]fluorine; trifunctional acrylates such as trimethylolpropane tri(meth)acrylate, dipentaerythritol tri(meth)acrylate, propionic acid-modified dipentaerythritol tri(meth)acrylate, pentaerythritol tri(meth)acrylate, propylene oxide-modified trimethylolpropane tri(meth)acrylate, trifunctional urethane (meth)acrylates, and tris(meth)acryloxyethylisocyanurate;

tetrafunctional acrylates such as diglycerin tetra(meth)acrylate and pentaerythritol tetra(meth)acrylate; pentafunctional acrylates such as dipentaerythritol penta(meth)acrylate; and hexafunctional acrylates such as dipentaerythritol hexa(meth)acrylate, caprolactone-modified dipentaerythritol hexa(meth)acrylate, and urethane (meth)acrylates (for example, reaction products of an isocyanate monomer and trimethylolpropane tri(meth)acrylate), without being limited thereto. These crosslinking agents may be used alone or in combination thereof.

Preferably, the crosslinking agent is a polyfunctional (meth)acrylate of a polyhydric alcohol containing 2 to 20 hydroxyl groups to provide good durability. The crosslinking agent may be present in an amount of about 0.001 parts by weight to about 5 parts by weight, and, in an embodiment, about 0.003 parts by weight to about 3 parts by weight, and, in an embodiment, about 0.005 parts by weight to about 1 part by weight, relative to 100 parts by weight of the monomer mixture. Within this range, the adhesive film can exhibit good adhesion and reliability.

The adhesive composition may further include a silane coupling agent. The silane coupling agent serves to allow the adhesive film to exhibit good reliability without bubbling or delamination even after being left in a frame having a certain radius of curvature under high temperature/humidity conditions for a predetermined period of time. The silane coupling agent may be a typical silane coupling agent known to those skilled in the art. For example, the silane coupling agent may include at least one selected from the group consisting of epoxylated silicon compounds such as 3-glycidoxypropyltrimethoxysilane, 3-glycidoxypropyltriethoxysilane, 3-glycidoxypropylmethyldimethoxysilane, and 2-(3,4-epoxycyclohexyl)ethyltrimethoxysilane; polymerizable unsaturated group-containing silicon compounds such as vinyltrimethoxysilane, vinyltriethoxysilane, and (meth)acryloxypropyltrimethoxysilane; amino group-containing silicon compounds, such as 3-aminopropyltrimethoxysilane, N-(2-aminoethyl)-3-aminopropyltrimethoxysilane, and N-(2-aminoethyl)-3-aminopropylmethyldimethoxysilane; and 3-chloropropyltrimethoxysilane, without being limited thereto. Preferably, the silane coupling agent is an epoxylated silane coupling agent. The silane coupling agent may be present in an amount of about 0.01 parts by weight to about 3 parts by weight, and, in an embodiment, about 0.01 parts by weight to about 1 part by weight, relative to 100 parts by weight of the monomer mixture. Within this range, the silane coupling agent can secure reliability of the adhesive film in a bent state under high temperature/humidity conditions as described above, and can provide a small difference in peel strength between low temperature, room temperature, and high temperature.

The adhesive composition may further include any of typical additives, such as curing accelerators, ionic liquids, lithium salts, inorganic fillers, softeners, molecular weight regulators, antioxidants, anti-aging agents, stabilizers, adhesion-imparting resins, reforming resins (polyol, phenol, acrylic, polyester, polyolefin, epoxy, epoxidized polybutadiene resins, and the like), leveling agents, defoamers, plasticizers, dyes, pigments (coloring pigments, extender pigments, and the like), processing agents, UV blocking agents, fluorescent whitening agents, dispersants, heat stabilizers, photostabilizers, UV absorbers, antistatic agents, coagulants, lubricants, solvents, and the like.

The adhesive composition for each of the first adhesive film and the second adhesive film may further include organic nanoparticles. Preferably, the first adhesive film optionally includes the organic nanoparticles and the second adhesive film includes the organic nanoparticles.

The organic nanoparticles exhibit good viscoelasticity at low temperature and/or room temperature and have a crosslinked structure, thereby exhibiting stable viscoelasticity under high temperature/humidity conditions. In one or more embodiments, the organic nanoparticles can form a chemical bond with the hydroxyl group-containing (meth)acrylic copolymer. Although the adhesive composition or the adhesive film includes the organic nanoparticles, a difference in refractive index between the organic nanoparticles having a certain average particle diameter described hereinafter and the hydroxyl group-containing (meth)acrylic copolymer can secure good transparency. The organic nanoparticles may have an average particle diameter of about 10 nm to about 400 nm, and, in an embodiment, about 10 nm to about 300 nm, and, in an embodiment, about 10 nm to about 200 nm, for example, about 10 nm, about 20 nm, about 30 nm, about 40 nm, about 50 nm, about 60 nm, about 70 nm, about 80 nm, about 90 nm, about 100 nm, about 110 nm, about 120 nm, about 130 nm, about 140 nm, about 150 nm, about 160 nm, about 170 nm, about 180 nm, about 190 nm, about 200 nm, about 210 nm, about 220 nm, about 230 nm, about 240 nm, about 250 nm, about 260 nm, about 270 nm, about 280 nm, about 290 nm, about 300 nm, about 310 nm, about 320 nm, about 330 nm, about 340 nm, about 350 nm, about 360 nm, about 370 nm, about 380 nm, about 390 nm, or about 400 nm. Within this range, the organic nanoparticles can be prevented or substantially prevented from agglomerating and can secure good transparency of the adhesive film. A difference in refractive index between the organic nanoparticles and the hydroxyl group-containing (meth)acrylic copolymer may be about 0.05 or less, and, in an embodiment, 0 to 0.03 or less, and, in an embodiment, 0 to 0.02 or less, for example, about 0.01, 0.02, 0.03, 0.04, or 0.05. Within this range, the adhesive film can exhibit good transparency.

The organic nanoparticles may have a core-shell structure or a simple structure, such as bead type nanoparticles, without being limited thereto. In an embodiment, the organic nanoparticles may have a core-shell structure, in which the core and the shell satisfy the following Equation 1:

$$Tg(c) < Tg(s), \qquad \text{<Equation 1>}$$

where $Tg(c)$ is the glass transition temperature (unit: °C.) of the core, and $Tg(s)$ is the glass transition temperature (unit: °C.) of the shell.

Herein, the term "shell" means an outermost layer of the organic nanoparticle. The core may be a spherical particle. In one or more embodiments, the core may include an additional layer surrounding the spherical particle so long as the core has a glass transition temperature satisfying the above Equation 1.

In an embodiment, the core may have a glass transition temperature of about −150° C. to about 10° C., and, in an embodiment, about −150° C. to about −5° C., and, in an embodiment, about −150° C. to about −20° C., for example, about −150° C., about −140° C., about −130° C., about −120° C., about −110° C., about −100° C., about −90° C., about −80° C., about −70° C., about −60° C., about −50° C., about −40° C., about −30° C., about −20° C., about −10° C., about 0° C., or about 10° C. Within this range, the adhesive film can exhibit good viscoelasticity at low temperature and/or room temperature. The core may include at least one of a poly(alkyl (meth)acrylate), a polybutadiene, and a polysiloxane, each having a glass transition temperature within this range.

The poly(alkyl (meth)acrylate) includes at least one of poly(methyl acrylate), poly(ethyl acrylate), poly(propyl acrylate), poly(butyl acrylate), poly(isopropyl acrylate), poly(hexyl acrylate), poly(hexyl methacrylate), poly(ethylhexyl acrylate), and poly(ethylhexyl methacrylate), without being limited thereto.

The polysiloxane may be, for example, an organosiloxane (co)polymer. The organosiloxane (co)polymer may be a non-cross-linked or cross-linked organosiloxane (co)polymer. The cross-linked organosiloxane (co)polymer may be used to secure impact resistance and colorability. In an embodiment, the cross-linked organosiloxane (co)polymer may include any of cross-linked dimethylsiloxane, methylphenylsiloxane, diphenylsiloxane, and mixtures thereof. With a copolymer of two or more organosiloxanes, the nanoparticles can have a refractive index of about 1.41 to about 1.50.

A cross-linked state of the organosiloxane (co)polymer can be determined based on the degree of dissolution in various organic solvents. As the degree of crosslinking of the organosiloxane (co)polymer intensifies, the degree of dissolution of the organosiloxane (co)polymer is reduced. A solvent for determination of the cross-linked state may include acetone, toluene, and the like. The organosiloxane (co)polymer may have a moiety which is not dissolved in acetone or toluene. The organosiloxane copolymer may include about 30% or more of insolubles in toluene.

The organosiloxane (co)polymer may further include an alkyl acrylate cross-linked polymer. The alkyl acrylate cross-linked polymer may include any of methyl acrylate, ethyl acrylate, n-butyl acrylate, 2-ethylhexyl acrylate, and the like. For example, the alkyl acrylate cross-linked polymer may be n-butyl acrylate or 2-ethylhexyl acrylate having a low glass transition temperature.

In an embodiment, the shell may have a glass transition temperature of about 15° C. to about 150° C., and, in an embodiment, about 35° C. to about 150° C., and, in an embodiment, about 50° C. to about 140° C., for example, about 15° C., about 20° C., about 25° C., about 30° C., about 35° C., about 40° C., about 45° C., about 50° C., about 55° C., about 60° C., about 65° C., about 70° C., about 75° C., about 80° C., about 85° C., about 90° C., about 95° C., about 100° C., about 105° C., about 110° C., about 115° C., about 120° C., about 125° C., about 130° C., about 135° C., about 140° C., about 145° C., or about 150° C. Within this range, the organic nanoparticles can exhibit good dispersion in the hydroxyl group-containing (meth)acrylic copolymer. The shell may include poly(alkyl methacrylate) having a glass transition temperature within this range. For example, the shell may include at least one of poly(methyl methacrylate) (PMMA), poly(ethyl methacrylate), poly(propyl methacrylate), poly(butyl methacrylate), poly(isopropyl methacrylate), poly(isobutyl methacrylate), and poly(cyclohexyl methacrylate), without being limited thereto. Preferably, the shell includes poly(methyl methacrylate).

The core or the shell may include two or more layers, and the outermost layer of the organic nanoparticles may include at least one poly(alkyl (meth)acrylate) having a glass transition temperature of about 15° C. to about 150° C. In an embodiment, the core may include at least one poly(alkyl (meth)acrylate) having a glass transition temperature of about −150° C. to about 10° C., or may include at least one poly(alkyl (meth)acrylate) without being limited by the glass transition temperature so long as the entire core has a glass transition temperature of about −150° C. to about 10° C., without being limited thereto. In addition, the shell may include at least one poly(alkyl (meth)acrylate) having a glass transition temperature of about 15° C. to about 150° C., or may include at least one poly(alkyl (meth)acrylate) without being limited by the glass transition temperature so long as the entire shell has a glass transition temperature of about 15° C. to about 150° C., without being limited thereto.

The shell may be present in an amount of about 1 wt % to about 70 wt %, and, in an embodiment, about 5 wt % to about 60 wt %, and, in an embodiment, about 10 wt % to about 50 wt %, for example, about 1 wt %, about 5 wt %, about 10 wt %, about 15 wt %, about 20 wt %, about 25 wt %, about 30 wt %, about 35 wt %, about 40 wt %, about 45 wt %, about 50 wt %, about 55 wt %, about 60 wt %, about 65 wt %, or about 70 wt %, in the organic nanoparticles. The core may be present in an amount of about 30 wt % to about 99 wt %, and, in an embodiment, about 40 wt % to about 95 wt %, and, in an embodiment, about 50 wt % to about 90 wt %, for example, about 30 wt %, about 35 wt %, about 40 wt %, about 45 wt %, about 50 wt %, about 55 wt %, about 60 wt %, about 65 wt %, about 70 wt %, about 75 wt %, about 80 wt %, about 85 wt %, about 90 wt %, about 95 wt %, or about 99 wt %, in the organic nanoparticles. Within these content ranges of the shell and the core, the adhesive film can maintain viscoelasticity in a wide temperature range and exhibit good recovery rate of the adhesive film.

The organic nanoparticles may be present in an amount of about 0.5 parts by weight to about 15 parts by weight, and, in an embodiment, about 0.5 parts by weight to about 10 parts by weight, and, in an embodiment, about 0.5 parts by weight to about 8 parts by weight, for example, about 0.5 parts by weight, about 1 part by weight, about 1.5 parts by weight, about 2 parts by weight, about 2.5 parts by weight, about 3 parts by weight, about 3.5 parts by weight, about 4 parts by weight, about 4.5 parts by weight, about 5 parts by weight, about 5.5 parts by weight, about 6 parts by weight, about 6.5 parts by weight, about 7 parts by weight, about 7.5 parts by weight, about 8 parts by weight, about 8.5 parts by weight, about 9 parts by weight, about 9.5 parts by weight, about 10 parts by weight, about 10.5 parts by weight, about 11 parts by weight, about 11.5 parts by weight, about 12 parts by weight, about 12.5 parts by weight, about 13 parts by weight, about 13.5 parts by weight, about 14 parts by weight, about 14.5 parts by weight, or about 15 parts by weight, relative to 100 parts by weight of the monomer mixture. Within this range, the adhesive film has good balance between viscoelasticity, modulus, and recovery.

In an embodiment, the organic nanoparticles may be included in a state of being polymerized with the monomer mixture in preparation of the hydroxyl group-containing (meth)acrylic copolymer. In this embodiment, the organic nanoparticles may be included in the hydroxyl group-containing (meth)acrylic copolymer. In another embodiment, the adhesive composition may include the organic nanoparticles together with a prepared hydroxyl group-containing (meth)acrylic copolymer. In this case, the organic nanoparticles may be included in the adhesive composition separately from the hydroxyl group-containing (meth)acrylic copolymer.

The adhesive composition may have a viscosity at 25° C. of about 300 cP to about 50,000 cP. Within this viscosity range, the adhesive composition can have good coatability and thickness uniformity.

Each of the first adhesive film and the second adhesive film may be formed of the adhesive composition described above. In order to form the first adhesive film having a lower restoration force or a higher modulus at −20° C. to 25° C. than the second adhesive film, the adhesive composition for the second adhesive film may have a higher amount of the hydroxyl group-containing (meth)acrylic copolymer (for example, about 1.5 times) than the adhesive composition for the first adhesive film in the monomer mixture. Alternatively, the adhesive composition for the second adhesive film may further include a higher amount (for example, 10 times) of the crosslinking agent or the organic nanoparticles than the adhesive composition for the first adhesive film.

Next, a method of preparing the adhesive composition will be described.

The adhesive composition may be prepared by mixing an initiator with a monomer mixture for a hydroxyl group-containing (meth)acrylic copolymer to polymerize the monomer mixture, followed by adding an initiator and, optionally, organic nanoparticles, a crosslinking agent, a silane coupling agent and various additives to the polymerized monomer mixture. Alternatively, the adhesive composition may be prepared by preparing a prepolymer through partial polymerization of the monomer mixture for the hydroxyl group-containing (meth)acrylic copolymer, followed by adding the organic nanoparticles to the prepolymer. Alternatively, the adhesive composition may be prepared by adding the organic nanoparticles to the monomer mixture for the hydroxyl group-containing (meth)acrylic copolymer, followed by partial polymerization or complete polymerization. The polymerization may include solution polymerization, suspension polymerization, photopolymerization, bulk polymerization, dispersion polymerization, or emulsion polymerization. Emulsion polymerization may be performed at about 50° C. to about 100° C. by adding the initiator to the monomer mixture and the organic nanoparticles in a liquid phase initiator. The initiator may include a radical photopolymerization initiator, and, in an embodiment, a radical photopolymerization initiator including at least one of azobisisobutyronitrile, potassium persulfate, tert-butylhydroperoxide and diisopropylbenzene hydroperoxide, without being limited thereto. Partial polymerization may include polymerization to have a viscosity at 25° C. of about 100 cP or more, and, in an embodiment, about 1,000 cP to about 20,000 cP after polymerization.

Next, a method of forming the adhesive film will be described.

Each of the first and second adhesive films may be prepared by applying the adhesive composition to a release film, for example, a polyethylene terephthalate (PET) film, to a thickness (e.g., a predetermined thickness), followed by drying and curing. In an embodiment, the adhesive composition may be applied to the PET film subjected to surface treatment. For example, the PET film may be subjected to surface treatment through corona pretreatment at about 250 mJ/cm$^2$ or more in order to increase peel strength of the first adhesive film and the second adhesive film, and, in an embodiment, peel strength at about 25° C. and about 60° C. Corona pretreatment may be performed using, for example, a corona processor (Now Plasma) to treat the PET film twice while discharging plasma at about 78 doses, without being limited thereto.

Next, the display part 91 will be described.

The display part 91 serves to drive the flexible display apparatus 100, and may include a substrate and an optical element including an organic light emitting diode (OLED), a light emitting diode (LED), or liquid crystal display (LCD) elements formed on the substrate.

In an embodiment, the display part 91 may include a lower substrate, thin film transistors, organic light emitting diodes, a flattening layer, a protective layer, and an insulation layer. The lower substrate supports the display part and may be formed with the thin film transistors and the organic light emitting diodes. The lower substrate may also be formed with a flexible printed circuit board (FPCB) for driving a touchscreen panel. The flexible printed circuit board may be further formed with a timing controller for driving an array of organic light emitting diodes, a power supply, and the like.

The lower substrate may include a substrate formed of a flexible resin. In an embodiment, the lower substrate may include a flexible substrate such as any of a silicon substrate, a polyimide substrate, a polycarbonate substrate, and a polyacrylate substrate, without being limited thereto.

In a display area of the lower substrate, plural pixel domains are defined by plural driving wires (not shown) and plural sensor wires (not shown) intersecting each other and each of the pixel domains may be formed with an array of organic light emitting diodes, each of which includes a thin film transistor and an organic light emitting diode connected to the thin film transistor. In a non-display area of the lower substrate, a gate driver applying electric signals to the driving wires may be formed in the form of a gate-in panel. The gate-in panel unit is formed on one or both sides of the display area.

The thin film transistor controls electric current flowing through a semiconductor by application of an electric field perpendicular to the electric current and may be formed on the lower substrate. The thin film transistor may include a gate electrode, a gate insulation layer, a semiconductor layer, a source electrode, and a drain electrode. The thin film transistor may be an oxide thin film transistor which uses an oxide such as indium gallium zinc oxide (IGZO), ZnO, or TiO as the semiconductor layer, an organic thin film transistor which uses an organic material as the semiconductor layer, an amorphous silicon thin film transistor which uses amorphous silicon as the semiconductor layer, or a polycrystalline silicon thin film transistor which uses polycrystalline silicon as the semiconductor layer.

The flattening layer covers the thin film transistor and a circuit section to flatten upper surfaces of the thin film transistor and the circuit section such that the organic light emitting diode can be formed thereon. The planarization layer may be formed of a spin-on-glass (SOG) film, a polyimide polymer, or a polyacrylic polymer, without being limited thereto.

The organic light emitting diode realizes a display through self-emission, and may include a first electrode, an organic light-emitting layer, and a second electrode, which are stacked in the stated order. Adjacent organic light emitting diodes may be isolated from each other by the insulation layer. The organic light emitting diode may have a bottom emission type structure wherein light generated from the organic light-emitting layer is emitted through the lower substrate, or a top-emission type structure wherein light from the organic light-emitting layer is emitted through the upper substrate.

The protective layer covers the organic light emitting diodes to protect the organic light emitting diodes. The protective layer may be formed of an inorganic insulation material, such as SiOx, SiNx, SiC, SiON, SiONC, and amorphous carbon (a-C), or an organic insulation material, such as (meth)acrylates, epoxy polymers, imide polymers, and the like. In an embodiment, the protective layer may include an encapsulation layer in which an inorganic material layer and an organic material layer are sequentially stacked once or plural times.

Next, the optical film 93 will be described.

The optical film 93 may be an optical element interposed between the first adhesive film 92 and the second adhesive film 94 to provide a function (e.g., a predetermined function) to the flexible display apparatus 100.

Although the optical film 93 is depicted as a single layer in FIG. 1, the optical film 93 may be a stack of a plurality of optical elements having the same function or a plurality of optical elements having different functions. In the structure of the optical film 93 composed of the stack of the plurality of optical elements, the first adhesive film and the second adhesive film described above, or typical optically clear adhesive (OCA) films may be used. In one embodiment, the optical film 93 may include at least one of a polarizing plate and a touchscreen panel. The polarizing plate can realize polarization of internal light or prevent or substantially prevent reflection of external light to realize a display, or can increase contrast of the display. The polarizing plate may be composed of a polarizer alone. Alternatively, the polarizing plate may include a polarizer and a protective film formed on one or both surfaces of the polarizer. Alternatively, the polarizing plate may include a polarizer and a protective coating layer formed on one or both surfaces of the polarizer. As the polarizer, the protective film, and the protective coating layer, a typical polarizer, a typical protective film, and a typical protective coating layer known in the art may be used. In addition, the polarizing plate may further include a retardation film, a compensation film, such as a λ/2 film and a λ/4 film, and a retardation liquid coating layer. The touchscreen panel generates electrical signals through detection of variation in capacitance when a human body or a conductor, such as a stylus, touches the touchscreen panel, and the display part may be driven by such electrical signals. The touchscreen panel is formed by patterning a flexible conductor, and may include first sensor electrodes and second sensor electrodes each formed between the first sensor electrodes and intersecting the first sensor electrodes. The touchscreen panel may include a conductive material, such as metal nanowires, conductive polymers, and carbon nanotubes, without being limited thereto. The touchscreen panel may include a base layer and the patterned conductor. The base layer may be formed of an insulating synthetic resin including, for example, polyethylene terephthalate, polyimide, polycarbonate, polyacrylate, and the like, or may be a polarizer or a polarizer protective film in order to secure a thin thickness thereof. In the present invention, the optical film may include a polarizing plate and a touchscreen panel formed on the polarizing plate. However, in the structure in which the optical film is a polarizing plate, the touchscreen panel may be directly formed on the display part 91.

Next, the window film 95 will be described.

The window film 95 may be disposed as an outermost layer of the flexible display apparatus 100 to protect the flexible display apparatus 100. The window film 95 may include a flexible window film. In an embodiment, the window film 95 may include a base layer and a window coating layer.

The base layer serves to support the window film and may be an optically transparent optical film. The optical film may have a total light transmittance of 90% or more in the visible range, and may include a flexible film formed of at least one selected from among polyester resins, such as polyethylene terephthalate, polyethylene naphthalate, polybutylene terephthalate, and polybutylene naphthalate, polycarbonate resins, polyimide resins, polyamide resins, polystyrene resins, poly(meth)acrylate resins including poly(methyl methacrylate), and the like. The optical film may have a thickness of 10 μm to 100 μm, and, in an embodiment, 20 μm to 75 μm, and, in an embodiment, 30 μm to 50 μm. Within this range, the optical film may be used as the base layer of the window film.

The base layer may be a film laminate including the optical film. In an embodiment, the film laminate may be a three- or more layer film laminate including two or more optical films, in which at least two optical films are stacked one above another via an adhesive film. The adhesive film may be formed of the adhesive composition comprising a monomer mixture for the hydroxyl group-containing (meth) acrylic copolymer and the organic nanoparticles. The adhesive composition may further include at least one of the initiator, the crosslinking agent, the silane coupling agent, and the additive. The adhesive film may be the same as or different from the first and second adhesive films.

In an embodiment, the film laminate may be a three-layer film laminate in which a first optical film and a second optical film are stacked via the adhesive film. Each of the first optical film and the second optical film may include at least one of a polyethylene terephthalate resin, a polycarbonate resin, a polyimide resin, a poly(meth)acrylate resin, a cyclic-olefin polymer resin, and an acrylic resin. Each of the first optical film and the second optical film may have a thickness of 10 μm to 100 μm, and, in an embodiment, 20 μm to 75 μm, and, in an embodiment, 30 μm to 50 μm, and the adhesive film may have a thickness of 10 μm to 100 μm. Within this range, the film laminate can maximize or increase impact resistance while maintaining good foldability of the flexible display apparatus. The first optical film and the second optical film may have the same or different thicknesses and may be formed of the same or different materials. The adhesive film may be the same as or different from the first and second adhesive films.

The window coating layer is formed on the base layer as the outermost layer of the flexible display apparatus and can become a flexible coating layer. For example, the window coating layer may include a coating layer formed of a siloxane resin. In another embodiment, the window film may include a base layer, a window coating layer formed on one side of the base layer, and a hardness enhancing coating layer formed on the other side of the base layer. The window film 95 may have a pencil hardness of about 6H or more, and, in an embodiment, about 6H to about 9H.

Herein, the present invention will be described in further detail with reference to some examples. It should be understood that these examples are provided for illustration only and are not to be construed in any way as limiting the present invention.

Preparation of Adhesive Film

The adhesive film was prepared using the following components.

(A) Monomer for forming hydroxyl group-containing (meth)acrylic copolymer
  (a1) 2-ethylhexyl acrylate (EHA)
  (a2) 4-hydroxybutyl acrylate (HBA)
  (a3) 2-hydroxyethyl acrylate (HEA)
  (a4) Acryloylmorpholine (ACMO)
(B) Organic nanoparticles Organic nanoparticles having a core-shell structure, an average particle diameter of 130 nm and an index of refraction of 1.48, and prepared by emulsion polymerization, in which the core is formed of poly(butyl acrylate) (PBA) and is present in an amount of 70 wt % in the organic nanoparticles, and the shell is formed of poly(methyl methacrylate) (PMMA) and is present in an amount of 30 wt % in the organic nanoparticles (C) Initiator
(c1) Photopolymerization initiator: Irgacure 651 (BASF)
(c2) Photopolymerization initiator: Irgacure 184 (BASF)
(D) Crosslinking agent: 1,6-hexanediol diacrylate Preparative Example 1

A mixture was prepared by sufficiently mixing 100 parts by weight of a monomer mixture (A) comprising 82 wt % of 2-ethylhexyl acrylate (a1) and 18 wt % of 4-hydroxybutyl acrylate (a2), 4 parts by weight of the organic nanoparticles (B), and 0.005 parts by weight of a photopolymerization initiator (c1) in a glass container. After replacing dissolved oxygen in the glass container with nitrogen, the mixture was subjected to partial polymerization through irradiation with UV light using a low pressure lamp (BL Lamp, Sankyo Co., Ltd.), thereby preparing a mixture comprising a hydroxyl group-containing (meth)acrylic copolymer (prepolymer) having a viscosity of about 2,000 cP, the monomers, and the organic nanoparticles. To the mixture, an additional photopolymerization initiator (c2) was added in an amount of 0.3 parts by weight relative to 100 parts by weight of the monomer mixture (A), thereby preparing an adhesive composition.

The adhesive composition was coated onto a polyester film (release film, polyethylene terephthalate film, thickness: 75 μm) to form an adhesive film having a thickness of 50 μm. With a 75 μm thick release film coated onto an upper side of the adhesive film, both sides of the adhesive film were irradiated with UV light using a low-pressure lamp (BL Lamp, Sankyo Co., Ltd.) for about 6 minutes, thereby obtaining a transparent adhesive sheet.

Preparative Examples 2 to 6

Transparent adhesive sheets were prepared by the same method as in Preparative Example 1 except that the amount of each component was changed as listed in Table 1.

Each of the adhesive films prepared in Preparative Examples 1 to 6 was evaluated as to the following properties, and evaluation results are shown in Table 1.

(1) Modulus: Viscoelasticity was measured at a shear rate of 1 rad/sec and a strain of 1% under auto-strain conditions using a rheometer (MCR-501, Anton Paar Co., Ltd.). After removal of the release film, 50 μm thick adhesive films were stacked to a thickness of 500 μm, followed by punching the stack using an 8 mm diameter punching machine, thereby preparing a specimen. Modulus was measured on the specimen while increasing the temperature from −60° C. to 90° C. at 5° C./min and storage modulus at each of −20° C., 25° C., and 80° C. was recorded.

Figure 2A:
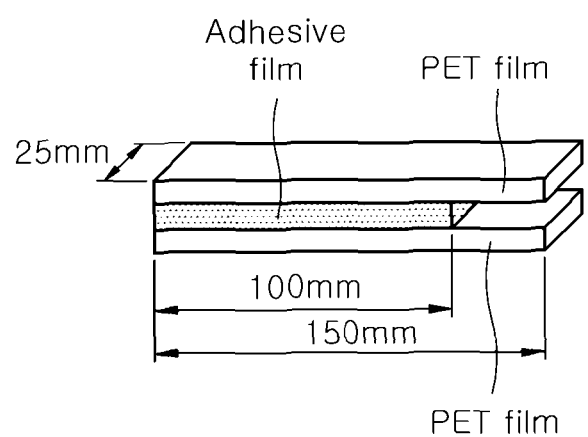
FIGS. 2A and 2B are conceptual diagrams of a specimen for measuring peel strength.
Figure 2B:
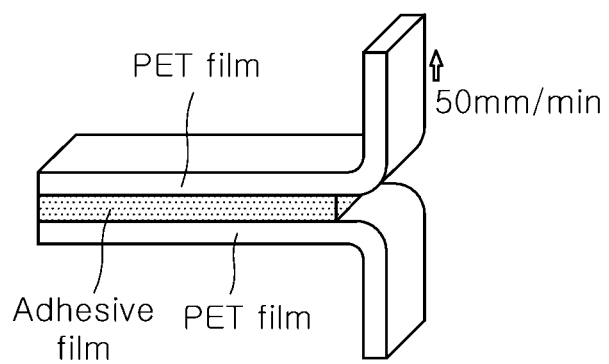

(2) Peel strength: A PET film having a size of 150 mm×25 mm×75 μm (length×width×thickness) was subjected to corona treatment twice (total dose: 156) under corona discharge at a dose of 78 using a corona treatment device. The corona-treated surfaces of the PET films were laminated on both surfaces of an adhesive film having a size of 100 mm×25 mm×50 μm (length×width×thickness), thereby preparing a specimen, as shown in FIG. 2A. The specimen was autoclaved under conditions of about 3.5 bar and about 50° C. for about 1,000 seconds and secured to a TA.XT_Plus texture analyzer (Stable Micro System Co., Ltd.). Referring to FIG. 2B, with each of the PET films secured at one side thereof to the TA.XT_Plus Texture Analyzer, T-peel strength at 25° C. was measured by pulling the other side of each of the PET films at 50 mm/min.

(3) Variation rate in yellowness index: Initial yellowness index (Y1) of an adhesive film was measured by a transmission method. Then, the yellowness index (Y2) of the adhesive film was measured by the same method after the adhesive film was left at 60° C. and 95% RH for 240 hours. The variation rate in yellowness index of the adhesive film was calculated based on Y1 and Y2 according to Equation A.

(4) Water vapor transmission rate: Water vapor transmission rate was measured in accordance with KS A 1013.

Figure 4A:
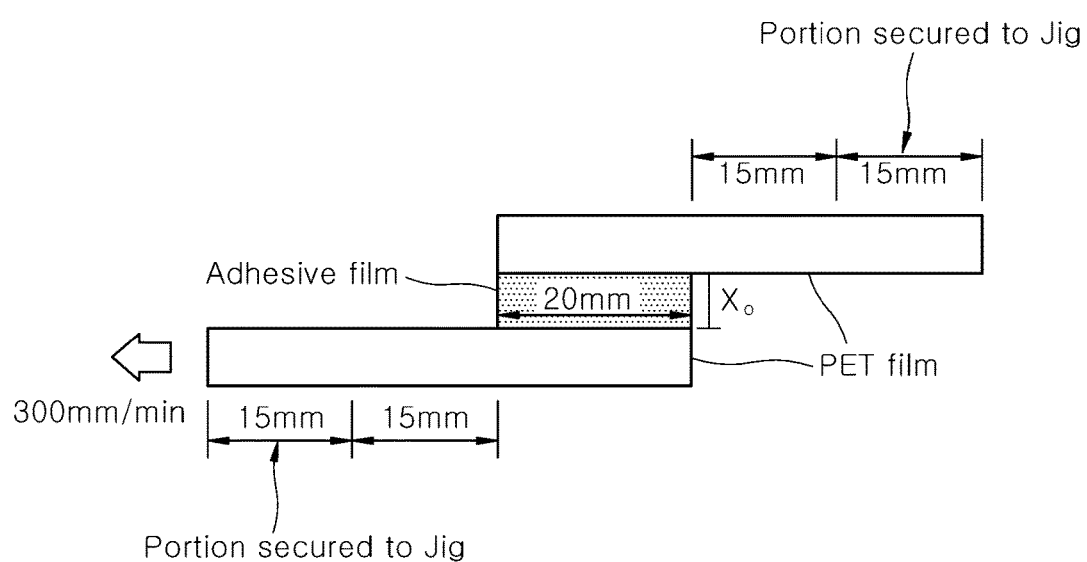
FIGS. 4A and 4B, respectively, are a sectional view and a plan view of a specimen for measuring restoration force.
Figure 4B:
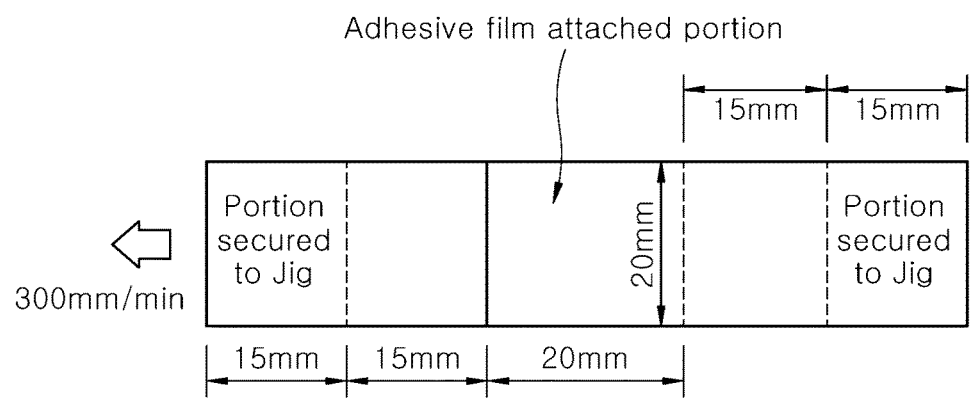
Figure 5:
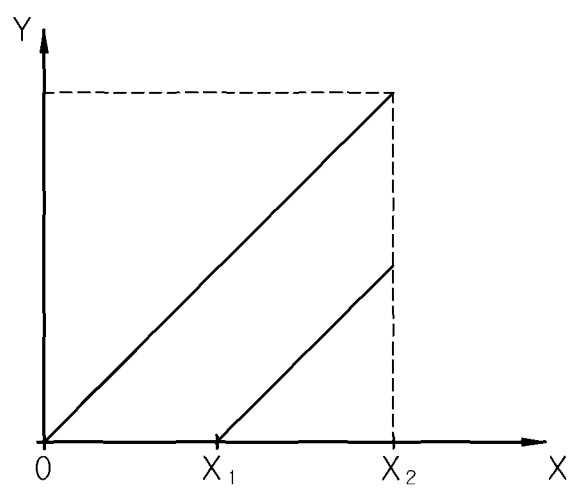
FIG. 5 is a graph for calculation of restoration force.

(5) Restoration force: An adhesive film was obtained by releasing a PET release film from each of the adhesive sheets prepared in the Examples and Comparative Examples. Restoration force was measured at 25° C. using a TA.XT_Plus Texture Analyzer (Stable Micro System Co., Ltd.). As shown in FIGS. 4A and 4B, a specimen was prepared by attaching two PET films (length×width×thickness: 50 mm×20 mm×75 μm) to each other via an adhesive film having a size of length×width: 20 mm×20 mm, such that two ends of the two PET films were attached to each other in order of the first PET film/adhesive film/the second PET film to have a contact area of length×width: 20 mm×20 mm between each of the PET films and the adhesive film. Jigs were secured to both ends of the PET films of the specimen. Here, a contact area between each of the first and second PET films and the jig was adjusted to length×width:15 mm×20 mm. With one of the jigs secured under a load of 10 MPa, the other jig was pulled at 300 mm/min until the adhesive film had a length $X_2$ (unit: μm) of 1,000% an initial thickness $X_0$ (unit: μm) thereof, that is, 10 times the initial thickness of the adhesive film, and was maintained for 10 seconds, followed by restoring the other jig at the same speed (i.e. at 300 mm/min) as the pulling speed. A stretched length of the adhesive film upon application of 0 kPa to the adhesive film after the adhesive film was stretched to a length of 1,000% the initial thickness thereof was defined as $X_1$. In the graph of FIG. 5, the X-axis is the stretched length of the adhesive film and the Y-axis is force applied to the adhesive film. Restoration force was calculated by Equation B.

TABLE 1

| | Preparative Example | | | | | |
|---|---|---|---|---|---|---|
| | 1 | 2 | 3 | 4 | 5 | 6 |
| EHA (wt %) | 82 | 65 | 82 | 82 | 65 | 80 |
| HBA (wt %) | 18 | 0 | 18 | 18 | 35 | 15 |
| HEA (wt %) | 0 | 35 | 0 | 0 | 0 | 0 |
| ACMO (wt %) | 0 | 0 | 0 | 0 | 0 | 5 |
| Initiator (c1) (parts by weight) | 0.005 | 0.005 | 0.005 | 0.005 | 0.005 | 0.005 |
| Initiator (c2) (parts by weight) | 0.3 | 0.3 | 0.3 | 0.3 | 0.3 | 0.3 |
| Organic nanoparticles (parts by weight) | 4 | 4 | 0 | 4 | 4 | 4 |

TABLE 1-continued

|  | Preparative Example | | | | | |
|---|---|---|---|---|---|---|
|  | 1 | 2 | 3 | 4 | 5 | 6 |
| Crosslinking agent (parts by weight) | 0 | 0 | 0.01 | 0.1 | 0 | 0 |
| Modulus (kPa); @−20° C. | 66.2 | 69.5 | 70 | 75 | 122 | 120 |
| Modulus (kPa); @25° C. | 26.6 | 38.2 | 29 | 37 | 40.1 | 40 |
| Modulus (kPa); @80° C. | 17.2 | 29 | 20.2 | 30 | 28.8 | 35 |
| Peel strength (gf/in); @25° C. | 1557 | 1710 | 1106 | 1683 | 1601 | 2300 |
| Variation rate in yellowness index (%) | 0 | 0 | 0 | 0 | 0 | 5 |
| Water vapor transmission rate (g/m$^2$ · 24 hr) | 270 | 190 | 230 | 180 | 200 | 170 |
| Restoration force (%) | 87.8 | 91.1 | 88.1 | 90.5 | 92.1 | 91.6 |

Example 1

Figure 3:
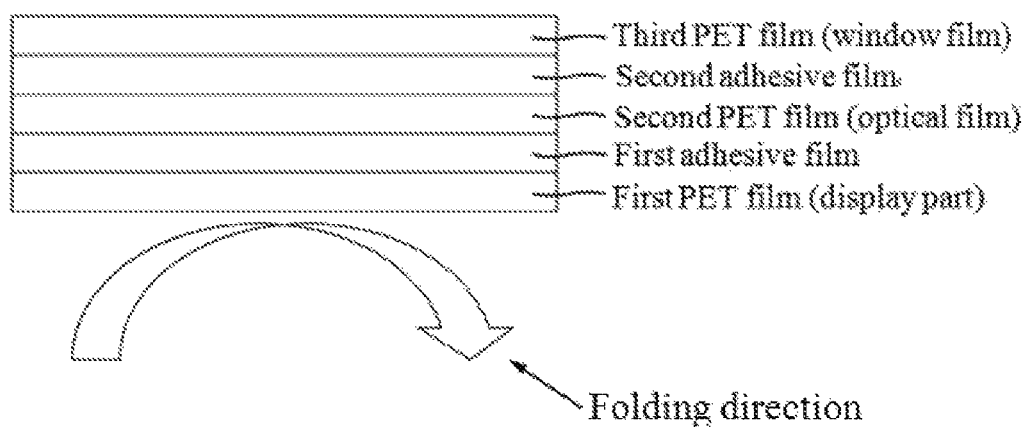
FIG. 3 is a schematic sectional view of a specimen for a folding test.

A specimen corresponding to a flexible display apparatus was prepared by sequentially stacking a display part, a first adhesive film, an optical film, a second adhesive film, and a window film, as shown in FIG. 3.
  Display part: First PET film (thickness: 100 μm, Cosmoshine TA015, Toyobo)
  First adhesive film: Adhesive film (thickness: 50 μm) formed of the adhesive composition of Preparative Example 1
  Optical film (Polarizing plate, touchscreen panel): Second PET film (thickness: 50 μm)
  Second adhesive film: Adhesive film (thickness: 50 μm) formed of the adhesive composition of Preparative Example 2
  Window film: Third PET film (thickness: 125 μm)

Example 2 and Comparative Examples 1 to 3

Specimens each corresponding to a flexible display apparatus were prepared in the same manner as in Example 1 except that the first adhesive film and the second adhesive film were changed as listed in Table 2.

The specimens prepared in Examples 1 and 2 and Comparative Examples 1 to 3 were evaluated as to the following properties, and evaluation results are shown in Table 2.

(1) Folding test: Each of the specimens prepared in the Examples and Comparative Example was cut to a size of 100 cm×160 cm (length×width) to prepare a specimen for folding testing, which in turn was autoclaved at 50° C. and 3.6 bar for 1,000 sec. As shown in FIG. 3, the specimen was secured to a folding test instrument (CFT series, COVOTEC Co., Ltd) in a state of being bent towards the display part such that the width of the specimen was halved, and was then subjected to 100,000 cycles of bending at 25° C. at a bending rate of 30 cycles per minute such that the bent portion of the specimen had a radius of curvature of 3 mm (1 cycle refers to an operation of folding the adhesive film in half once and unfolding the adhesive film back). After 100,000 cycles of bending, a specimen suffering from delamination or bubble generation was rated as x and a specimen having no delamination or bubble generation was rated as ○.

(2) Damage to OLED panel by impact: After an OLED panel was attached to each of the specimens prepared in the Examples and Comparative Examples by removing the first PET film corresponding to the display part, damage to the OLED panel was evaluated by a ball drop method. Specifically, after a 30 g steel ball was dropped from a height of 5 cm onto the OLED panel, electric power was applied to the OLED panel. Normal operation of the OLED panel was evaluated as OK and abnormal operation of the OLED panel was evaluated as NG.

(3) Damage to OLED panel by moisture: After an OLED panel was attached to each of the specimens prepared in the Examples and Comparative Examples by removing the first PET film corresponding to the display part, the specimens were left at 60° C. and 93% RH for 24 hours, and electric power was applied to the OLED panel. Normal operation of the OLED panel was evaluated as OK and abnormal operation of the OLED panel was evaluated as NG.

(4) Bubble generation area ratio: Each of the specimens prepared in the Examples and Comparative Examples was cut to a size of length×width: 160 mm×100 mm, bent towards the display part such that the specimen was placed between parallel frames having a gap of about 1 cm therebetween and the width of the specimen was halved, and subjected to aging at 60° C. and 93% RH for about 24 hours, followed by analyzing an image, which was obtained by photographing a portion of the specimen suffering from bubble generation using an optical microscope (EX-51, Olympus Co., Ltd., magnification: 30×), using Mac-View software (Mountech Co., Ltd.) in order to measure a ratio (%) of the total area occupied by bubbles to the area of the specimen as the bubble generation area ratio.

TABLE 2

| Item | | Property | Example 1 | Example 2 | Comparative Example 1 | Comparative Example 2 | Comparative Example 3 |
|---|---|---|---|---|---|---|---|
| First adhesive film | | Adhesive film | Preparative Example 1 | Preparative Example 3 | Preparative Example 3 | Preparative Example 5 | Preparative Example 1 |
|  | Modulus | @−20° C. | 66.2 | 70 | 70 | 122 | 66.2 |

TABLE 2-continued

| Item | | Property | Example 1 | Example 2 | Comparative Example 1 | Comparative Example 2 | Comparative Example 3 |
|---|---|---|---|---|---|---|---|
| (lower adhesive film) | (kPa, G') | @25° C. | 26.6 | 29 | 29 | 40.1 | 26.6 |
| | | @80° C. | 17.2 | 20.2 | 20.2 | 28.8 | 17.2 |
| | | Restoration force (%) | 87.8 | 88.1 | 88.1 | 92.1 | 87.8 |
| | | Peel strength (gf/in, @25° C.) | 1557 | 1106 | 1106 | 1601 | 1557 |
| | | Water-vapor transmission rate (g/m² · 24 hr) | 270 | 230 | 230 | 200 | 270 |
| Second adhesive film (upper adhesive film) | | Adhesive film | Preparative Example 2 | Preparative Example 4 | Preparative Example 1 | Preparative Example 6 | Preparative Example 3 |
| | Modulus (kPa, G') | @-20° C. | 69.5 | 75 | 66.2 | 120 | 70 |
| | | @25° C. | 38.2 | 37 | 26.6 | 40 | 29 |
| | | @80° C. | 29 | 30 | 17.2 | 35 | 20.2 |
| | | Restoration force (%) | 91.1 | 90.5 | 87.8 | 91.6 | 88.1 |
| | | Peel strength (gf/in, @25° C.) | 1710 | 1683 | 1557 | 2300 | 1106 |
| | | Water-vapor transmission rate (g/m² · 24 hr) | 190 | 180 | 270 | 170 | 230 |
| | | Folding test | ○ | ○ | X | X | ○ |
| | | Damage to OLED panel by impact | OK | OK | OK | NG | OK |
| | | Damage to OLED panel by moisture | OK | OK | NG | OK | NG |
| | | Bubble generation area ratio (%) | 0 | 0 | 0 | 7 | 0 |

As shown in Table 2, the flexible display apparatus of the Examples exhibited good foldability even when folded towards the display part, and could prevent damage to the OLED panel by impact and moisture.

Accordingly, a flexible display apparatus according to an aspect of the present invention has good foldability under low temperature to high temperature and/or high humidity conditions when folded towards a display part thereof. According to another aspect of the present invention, a flexible display apparatus can prevent or substantially prevent damage to a display part, for example, an OLED panel, by moisture and/or oxygen while improving impact resistance of the OLED panel. According to another aspect of the present invention, a flexible display apparatus including an adhesive film has a low yellowness variation rate to provide high reliability under high temperature and/or high humidity conditions. According to another aspect of the present invention, a flexible display apparatus can prevent or substantially prevent bubble generation, cracking, and/or delamination under high temperature and/or high humidity conditions, and can secure good reliability and durability by securing good adhesion between a display part, an optical film, and a window film.

Although some embodiments have been described herein, it is to be understood that these embodiments are given by way of illustration only and that various modifications, changes, alterations, and equivalent embodiments can be made by those skilled in the art without departing from the spirit and scope of the present invention.

What is claimed is:

1. A flexible display apparatus comprising: a display part, a first adhesive film, an optical film, a second adhesive film, and a window film sequentially stacked,
the second adhesive film having a water vapor transmission rate of about 200 g/m²·24 hr or less, and
the first adhesive film having a lower restoration force than the second adhesive film as calculated by the following Equation B:

Restoration force=$(1-(X_1)/(X_2))\times 100$, where $X_1$ and $X_2$ are values obtained as follows: where both ends of a polyethylene terephthalate (PET) film are defined as a first end and a second end, respectively, a specimen for calculation of restoration force is prepared by attaching a first PET film and a second PET film to each other via an adhesive film having a size having a length of 20 mm and a width of 20 mm, such that a first end of the first PET film and a second end of the second PET film are attached to each other in order of the first end of first PET film, the adhesive film, and the second end of second PET film, and a jig is secured to a second end of the first PET film and a first end of the second PET film, respectively, and with one of the jigs secured under a load of 10 MPa, the other jig is pulled at 25° C. and at 300 mm/min until the adhesive film has a length of $X_2$ of 1,000% of an initial thickness thereof, and is maintained for about 10 seconds, followed by restoring the other jig at 300 mm/min to obtain a stretched length of $X_1$ of the adhesive film upon application of 0 kPa to the adhesive film in a graph wherein the X-axis is the stretched length of the adhesive film and the Y-axis is force applied to the adhesive film.

2. The flexible display apparatus according to claim 1, wherein the flexible display apparatus has a bubble generation area ratio of 0%, as measured on a specimen obtained by sequentially stacking a polyethylene terephthalate (PET) film having a thickness of 100 μm as the display part, the first adhesive film having a thickness of 50 μm, a PET film having a thickness of 50 μm as the optical film, the second adhesive film having a thickness of 50 μm, and a PET film having a thickness of 125 μm as the window film and cut to a size having a length of 160 mm and a width of 100 mm, the bubble generation area ratio being measured after aging the specimen at 60° C. and 93% RH for about 24 hours, with the specimen bent towards the display part such that the specimen is placed between parallel frames having a gap of about 1 cm therebetween and the width of the specimen is halved.

3. The flexible display apparatus according to claim 1, wherein the first adhesive film has a lower modulus than the second adhesive film at −20° C. to 25° C.

4. The flexible display apparatus according to claim 1, wherein a ratio of the restoration force of the second adhesive film to the restoration force of the first adhesive film is greater than 1 to 1.5.

5. The flexible display apparatus according to claim 1, wherein the restoration force of the first adhesive film is about 40% to about 90%.

6. The flexible display apparatus according to claim 1, wherein the restoration force of the second adhesive film is about 50% to about 95%.

7. The flexible display apparatus according to claim 1, wherein each of the first adhesive film and the second adhesive film has a ratio of modulus at 80° C.:modulus at −20° C. of about 1:1 to about 1:10.

8. The flexible display apparatus according to claim 1, wherein each of the first adhesive film and second adhesive film has a variation rate in yellowness index of about 5% or less, as calculated by the following Equation A:

Variation rate in yellowness index=|$Y2-Y1$|/$Y1$×100, where Y1 is an initial yellowness index of the adhesive film, and Y2 is a yellowness index of the adhesive film measured after leaving the adhesive film at 60° C. and 95% relative humidity (RH) for 240 hours.

9. The flexible display apparatus according to claim 1, wherein the optical film comprises at least one of a polarizing plate and a touchscreen panel.

10. The flexible display apparatus according to claim 1, wherein the optical film comprises a polarizing plate, and further comprises a touchscreen panel directly formed on the display part.

11. The flexible display apparatus according to claim 1, wherein each of the first adhesive film and second adhesive film has a peel strength of about 800 gf/in or more at 25° C.

12. The flexible display apparatus according to claim 1, wherein each of the first adhesive film and second adhesive film comprises a cured product of an adhesive composition comprising: a monomer mixture for a hydroxyl group-containing (meth)acrylic copolymer; and an initiator.

13. The flexible display apparatus according to claim 12, wherein the adhesive composition for the second adhesive film further comprises organic nanoparticles, the organic nanoparticles having an average particle diameter of about 10 nm to about 400 nm.

14. The flexible display apparatus according to claim 13, wherein the organic nanoparticles have a core-shell structure, a core and a shell of the core-shell structure having glass transition temperatures satisfying the following Equation 1:

$Tg(c)<Tg(s)$, where Tg(c) is the glass transition temperature (° C.) of the core, and Tg(s) is the glass transition temperature (° C.) of the shell.

15. The flexible display apparatus according to claim 13, wherein the organic nanoparticles are present in an amount of about 0.5 parts by weight to about 15 parts by weight, relative to 100 parts by weight of the monomer mixture.

16. The flexible display apparatus according to claim 12, wherein the monomer mixture comprises about 60 wt % to about 95 wt % of an alkyl (meth)acrylate and about 5 wt % to about 40 wt % of the hydroxyl group-containing (meth)acrylate.

17. The flexible display apparatus according to claim 1, wherein the window film comprises a three-layer film laminate comprising a first optical film, a second optical film, and an adhesive film between the first optical film and the second optical film.

18. The flexible display apparatus according to claim 17, wherein each of the first optical film and the second optical film is formed of at least one of a polyester resin, a polycarbonate resin, a polyimide resin, a poly(meth)acrylate resin, a cyclic-olefin polymer resin, and an acrylic resin.

19. The flexible display apparatus according to claim 17, wherein each of the first optical film and the second optical film has a thickness of 10 μm to 100 μm, and the adhesive film has a thickness of 10 μm to 100 μm.

20. The flexible display apparatus according to claim 17, wherein the adhesive film is formed of an adhesive composition comprising a monomer mixture for a hydroxyl-group containing (meth)acrylic copolymer and organic nanoparticles.

* * * * *